United States Patent [19]

Shannon

[11] 4,072,376
[45] Feb. 7, 1978

[54] SOCKET ASSEMBLIES

[75] Inventor: Suel Grant Shannon, Harrisburg, Pa.

[73] Assignee: AMP Incorporated, Harrisburg, Pa.

[21] Appl. No.: 534,113

[22] Filed: Dec. 18, 1974

Related U.S. Application Data

[63] Continuation of Ser. No. 422,489, Dec. 6, 1974, abandoned.

[51] Int. Cl.² .......................................... H01R 13/48
[52] U.S. Cl. ............................. 339/17 C; 339/59 M; 339/194 N
[58] Field of Search .......... 339/4, 17 R, 17 C, 17 CF, 339/17 L, 59, 121, 154, 156, 157, 193, 194; 206/329–331, 343, 390; 174/68.5

[56] References Cited

U.S. PATENT DOCUMENTS

| | | | |
|---|---|---|---|
| 2,882,512 | 4/1959 | Morone | 339/193 R |
| 2,931,006 | 3/1960 | Klumpp | 339/59 M X |
| 3,046,516 | 7/1962 | Tymkewicz | 339/126 R |
| 3,082,397 | 3/1963 | Clarkson et al. | 339/157 R |
| 3,164,250 | 1/1965 | Paxton | 206/343 |
| 3,241,094 | 3/1966 | Harton | 339/193 R X |
| 3,337,833 | 8/1967 | Creedon | 339/221 M X |
| 3,383,648 | 5/1968 | Tems | 339/17 C X |
| 3,530,422 | 9/1970 | Goodman | 339/17 L |
| 3,538,389 | 11/1970 | Levesque et al. | 174/68.5 X |
| 3,721,944 | 3/1973 | Weidler | 339/19 |
| 3,777,285 | 12/1973 | Barr | 339/17 CF |

OTHER PUBLICATIONS

Circuit - Stik, Inc., "Instant Circuit Boards", 1970, Catalog No. 501, pp. 1-16.
Chatlos et al., "Light-Emitting Diode Mounting Block", IBM Tech. Disc. Bulletin, vol. 15, No. 1, p. 48, 6-1972.

Primary Examiner—Joseph H. McGlynn
Attorney, Agent, or Firm—Donald W. Phillion

[57] ABSTRACT

A series of socket assemblies is fabricated of a single strip of flexible material having socket interconnection necks enabling selective separation of adjacent socket assemblies. Each assembly includes a plurality of component-lead receiving sockets in an appropriate configuration inserted into holes in the flexible strip to be insertable into corresponding holes of a printed circuit board. The assembly also has partially formed holes to ride upon the printed circuit board to provide a socket standoff therefrom.

The socket assemblies are insertable as a unit, or individually, as desired, and allow reduction in the manufacturing tolerances of the positional and axial alignment of the socket receiving holes of the printed circuit board.

7 Claims, 5 Drawing Figures 4,072,376

SOCKET ASSEMBLIES

CROSS-REFERENCE TO RELATED APPLICATION

This application is a continuation application of Ser. No. 422,489, filed Dec. 6, 1974, by Suel Grant Shannon and entitled "Socket Assemblies", now abandoned.

BACKGROUND OF THE INVENTION

1. Field of the Invention

This invention relates to improvements in electrical sockets, and more particularly to improvements in sockets for receiving the leads of an electrical component, or the like, for connection with leads of a printed circuit board, or the like.

2. Description of the Prior Art

With recent emphasis towards miniaturizing and microminiaturizing the physical size of electrical circuits, one of the principal structures employed to carry and support integrated circuit packages are printed circuit boards, formed generally of an insulating substrate, such as plastic, fiberglass, or the like, upon which conductive strips or leads are plated, etched, or formed, to function as interconnecting conductors between the desired electrical components.

Typically the conductive leads of such boards are designed to present a pattern for convenient physical location of the elctrical components to be mounted. The leads of the components, such as resistors, capacitors, transistors, integrated circuits, and the like, are ordinarily mounted in holes formed through the substrate of the board, usually at a terminal or intermediate location along an appropriate electrically conducting strip on the board. For good electrical contact to the component lead, frequently the holes are plated with a conductive material within the substrate, and the inserted component lead is soldered or physically attached to make electrical contact with the associated board lead. The holes are usually located by the circuit designer at the locations necessary for receiving connections to the appropriate component leads. For example, if a resistor is to be mounted onto the board, the two holes for receiving the component leads of the resistor can be located at a spacing somewhat larger than the length of the resistor to enable the resistor leads to be bent and inserted through the holes. Likewise, to receive the leads of a transistor, three holes may be located in an aligned configuration or in a triangular configuration, depending upon the configuration of the leads extending from the transistor device itself. The particular locations, therefore, of the component leads and their associated component lead receiving holes are, for the most part, arrangeable for the particular application desired.

For further ease in the mounting of components, especially multilead integrated circuits and the like, onto printed circuit boards, frequently individual component lead receiving sockets are mounted onto the board within the preformed holes, for instance, one socket per hole, to receive a single component lead. Usually such individual lead receiving sockets are hand mounted onto the printed circuit board by inserting a portion of the individual socket into its respective hole, and hand soldering it into the inserted location. The hand soldering and hand mounting of the individual lead receiving sockets involves detailed, time consuming work, which detracts somewhat from the desireability of including the sockets in the first place-the time saving convenience in locating and establishing electrical connection to the components on the printed circuit board. On the other hand, the individual lead sockets can be machine mounted, if desired, but such machines are ordinarily large and require large capital investments, which may not be appropriate in many printed circuit board fabrication facilities.

Alternatively, a number of individual lead sockets can be premounted into a single socket unit. This is typically done by forming a header or a base and hand or machine mounting the desired number of individual lead receiving sockets into it. Such mounting of the individual lead sockets into the header is usually done by hand or by specially designed equipment, again often undesireably requiring large capital investments. The base containing the individual sockets can then be mounted into a corresponding series of holes formed on the printed circuit board in a configuration suitable to receive the particular connection or pin configuration displayed by the header or socket unit and soldered by hand, machine, or otherwise, into place. For example, wave soldering techniques are commonly employed to achieve such solder connections to the printed circuit board; however, with most such socket units (and with the individual lead sockets themselves mounted directly into the board), particular care must be taken to prevent excess solder from flowing by capillary action or otherwise over the lead receiving opening of the individual sockets to clog or obstruct the sockets or to interfere with the subsequent insertion of the component leads.

With the printed circuit board and the premounted socket units thus fabricated; the leads of the components can be subsequently easily manually inserted into the appropriate socket to complete the assembly of the unit. Nevertheless, such discrete socket units are usually of realtively large size, the base or header being made of bakelite, plastic, or the like, molded into the desired configuration to contain almost the entire structure of the individual lead receiving sockets. This results in the entire structure of the individual lead sockets being located above the surface of the board, thereby increasing its physical dimensions. Also, because the header units are molded, it is apparent that repairs to the mold or die structures or the the individual socket inserting equipment can be particularly costly, and, in small scale manufacturing operations, may not be warranted by the number of units to be produced.

Another disadvantage in such discrete header or socket installations is that the manufacturing tolerances of the holes of the printed circuit board for receiving the leads of the socket units must be carefully controlled. A misalignment, for example, either in the spacing location or in the angle of the center line axis of the holes may prevent the socket from being insertable at the intended location, requiring special attention to complete the fabrication of the board, if possible at all.

BRIEF SUMMARY OF THE INVENTION

In light of the above, it is, therefore, an object of the invention to provide a series of component lead receiving sockets for installation individually or in a series upon a printed circuit board or the like.

It is another object of the invention to provide a header of simple construction for use in forming a plurality of sockets which can be installed in a series into corresponding sets of holes in a printed circuit board or the like.

It is still another object of the invention to porvide a header for use in fabricating a series of sockets for insertion into a printed circuit board or the like on which the individual or the sets of socket receiving holes need not be strictly spaced or aligned.

It is another object of the invention to present a socket for receiving leads of a discrete component.

It is another object of the invention to present a method for inserting a plurality of component receiving sockets onto a printed circuit board or the like.

It is still another object of the invention to provide a neck structure for joining a pair of socket wafers to facilitate selective separation thereof, and to provide a bias opposing tortional forces which urge the wafers in misalignment.

It is yet another object of the invention to provide a wafer for use in fabricating a component receiving socket.

These and other objects, features, and advantages, will become apparent to those skilled in the art from the following detailed description, when read in conjunction with the accompanying drawings and appended claims.

The invention, in its broad aspect, presents a header of flexible material for use in forming a plurality of socket assemblies, each carrying a plurality of female sockets to receive the individual leads of an electrical component, such as an integrated circuit. The component lead receiving sockets each have a portion extending through the header and a portion to receive the component lead, the portion extending through the header serving to provide a pin for insertion and connection into a hole of a printed circuit board. The header is formed of a thin strip of flexible material, including a series of socket configuration shaped portions and interconnecting portions between the socket portions. The socket configuration shaped portions have a plurality of holes therethrough each extending from a location near one edge to near the other, to define a pair of interconnecting tabs enabling the socket portions to be easily removed one from the other, if desired, yet providing a sufficient interconnection capability if the sockets are used in a continuous series installation. In such series, the interconnecting portion additionally provides a bias to the sockets to urge them into substantial alignment. Thus, when the series of holes in the printed circuit board corresponding to the socket pins of individual sockets are misaligned, the bias acts to maintain the pins in inserted position in the holes.

Utilizing this header, in accordance with the invention, a strip of sockets are thus provided into which a plurality of female socket members are inserted.

In yet another aspect of the invention, a method is provided for forming a plurality of component receiving sockets upon a printed circuit board of the tupe having a corresponding plurality of a series of holes therein, each series for receiving a respective one of the sockets. The method includes the steps of providing a plurality of flat, flexible wafers interconnected with a flexible neck, inserting individual component receiving sockets having a member for insertion into one of the holes of the printed circuit board into the holes in the wafers, aligning a first of the component receiving sockets for insertion into one of the corresponding series of holes, and sequentially inserting the others of said plurality of components into the holes. The particular socket configuration, in accordance with the invention, permits the entire series of sockets to be substantially simultaneously inserted.

BRIEF DESCRIPTION OF THE DRAWINGS

The above mentioned and other objects and features of the invention will be more fully understood from the following detailed description when read in conjunction with the drawings in which.

DETAILED DESCRIPTION OF THE PREFERRED EMBODIMENTS

Figure 1:
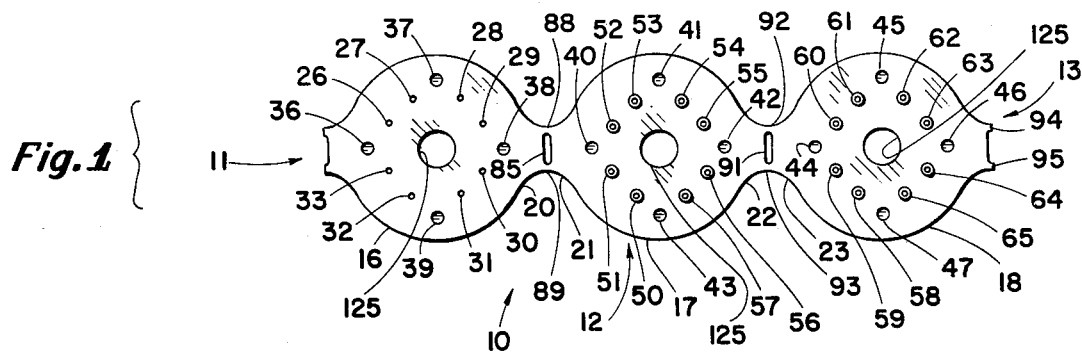
FIG. 1 is a plan view of a strip presenting a plurality of sockets, in accordance with the invention.
Figure 2:
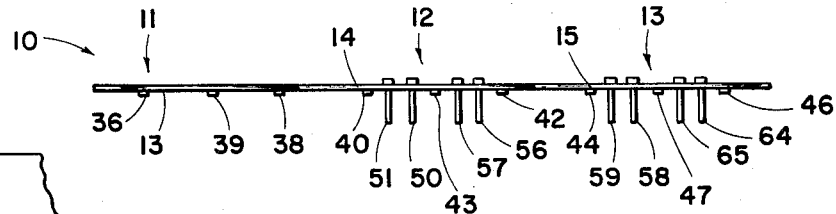
FIG. 2 is a front elevation of the plurality of sockets of FIG. 1.

The spring socket wafer assembly, in accordance with the invention, is shown in FIGS. 1 and 2, and denoted generally by the reference numeral 10. The sockets 11, 12, and 13 of the assembly are formed in a series or string of attached adjacent wafers 16, 17, and 18, three of which being illustrated, although it should be understood that in the manufacture or installation of the sockets 11–13, any number may be fabricated in the string, as needed or for convenience, as will become apparent below.

The wafers 16–18 are interconnected by neck portions 20 and 21, 22 and 23. Thus, the wafers 16–18 and joining necks 20–23 are formed from a single thin strip of flexible material, such as nylon, or the like. In the embodiment illustrated, the sockets 11–13 are of circular shape; however, other convenient shapes or configurations can be equally advantageously employed, depending upon the particular use or application to which the sockets are employed. A plurality of holes 26–33, shown in the socket 11 of the string, from which the female socket assemblies have been removed for illustration, are formed at the desired spaced relationship through the wafer 16. In the embodiment shown, the holes are formed in a rectangular pattern, but can easily be formed in any other convenient or desired pattern to accommodate the particular pin arrangement of the integrated circuit or electrical component intended to be installed. It should also be noted that whatever pattern is chosen, the hole pattern of the printed circuit board into which the socket formed will be installed should have the same general configuration, although some tolerance may be acceptable, as below explained. Since the circuit board with which the sockets are intended to be used are frequently specially designed, this hole pattern requirement usually presents no problem. Each of the sockets 11–13 additionally has four partially formed or punched holes 36–47, the material from the partially punched holes extending downwardly from the bottom surface of the wafers to provide a standoff which will bear upon the printed circuit board when the socket is inserted thereinto (see FIG. 2).

Figure 3:
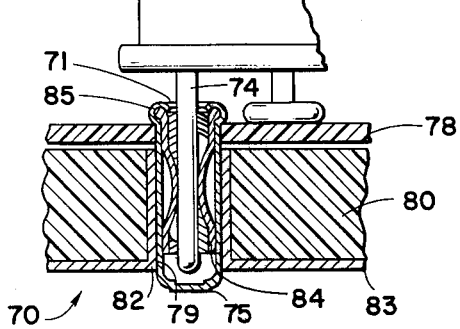
FIG. 3 is a cutaway portion of one of the sockets of FIG. 2 embodying a spring clip component lead receiving socket with the component lead inserted thereto in inserted position in a printed circuit board.

In each of the formed holes 33–47, a miniature component lead receiving socket is placed, located as shown by the miniature component lead receiving sockets 50–65 of the sockets 12 and 13. The details of a typical component receiving socket 70 are shown in FIG. 3. Each component receiving socket includes a female end 71 into which a component lead 74 of a component 75, such as an integrated circuit, can be inserted, and includes a male end 75, which will extend beyond the bottom surface of the wafer 78, to be insertable into a hole 79 in a printed circuit board 80. When the component lead receiving socket 70 is inserted into the hole 79, the male portion 75 makes electrical contact with the conductor material 82 previously formed within the hole. The conductor material 82, in turn, is electrically connected to a conducting lead 83 plated on the printed circuirt board 80, connected elsewhere in the circuit. Within the component socket 70 is a spring clip 84, which is retained in position by a curved top portion 85 adjacent the female end 71 of the socket 70. The spring clip 84 engages the inserted component lead 74 to maintain it in the inserted position and to establish an electrical conduction path between the component lead 74 and the lead 83 of the printed circuit board 80.

The component lead receiving socket 70 shown in FIG. 3 is shown as an examplar of the type of lead receiving sockets which can be used in practicing the invention. It is apparent that any type of lead contacting socket which can be located within the receiving holes of the flexible wafer to contact the leads of a desired substrate, of, for instance, a printed circuit board, can be equally advantageously employed.

Thus, as shown in FIGS. 1 and 2 with the lead sockets 50–65 inserted into respective holes of the wafers 17 and 18, the male portions thereof extend downwardly from the wafers to thereby be insertable into corresponding holes in a printed circuit board. To constrain the sockets 50–65 in their respective holes in the wafers, the size of the holes in the wafers are formed with a smaller diameter than that of the male portions of the sockets. The sockets upon insertion into the holes will, therefore, snugly fit, so as not to be pushed out easily upon insertion into the holes of the printed circuit board.

As above described, the necks 20 and 21, and 22 and 23 joining the adjacent sockets are formed of the same material from which the sockets themsleves are formed. For example, in the fabrication of the strip shown in FIGS. 1 and 2, a single strip of nylon or other material is cut, stamped, or otherwise formed into the general configuration shown, including the socket portions, the neck portions, and the fully and partially formed holes. To enable the wafers to be selectively removed or separated, one from the other, a slot or hole is formed in the neck portions, as shown, from near one side, to near the other. Thus, as shown, the neck portions 20 and 21 are separated by a hole 85 to present two thin members or portions 88 and 89 which form the junction between adjacent socket wafers 16 and 17. Likewise, the neck portions 22 and 23 are separated by a hole 91 to present joining members 92 and 93 between adjacent socket wafers 17 and 18, and so forth.

The sockets of the socket assembly 10 can be used, as necessary, either singely or in a series as shown. For example, by virtue of the slotted necks joining adjacent sockets, if one socket, or any desired number of sockets, are desired, they can easily be broken off or separated from the series at the slot, merely by tearing or bending the neck, as shown by the broken neck portions 94 and 95 on the wafer 18. On the other hand, if a series of sockets are desired for insertion, the entire series presenting the desired number of sockets can be inserted as a unit into a printed circuit board.

Figure 4:
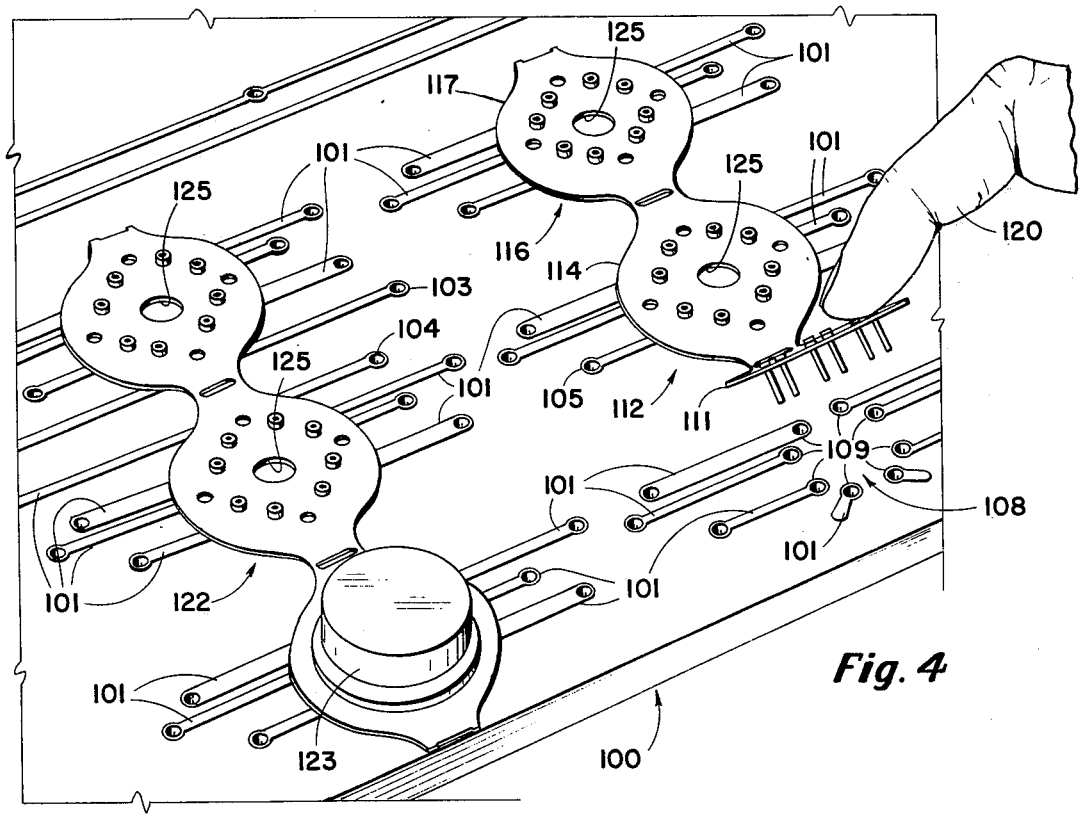
FIG. 4 is a perspective view of one side of a printed circuit board on which a pair of socket assemblies in accordance with the invention have been installed.

Thus, with reference to FIG. 4, a particular printed circuit board 100 with which a socket assembly in accordance with the invention is intended to be used has a spaced location there upon the holes for receiving the male portion of the pins of each of the sockets. For example, in the design of the printed circuit board, the conductive leads 101 which are formed onto the printed circuit board will be designed to terminate at holes such as holes 103, 104, and 105, corresponding to the desired connection with a particular electronic component, such as a capacitor, resistor, or the like. At the desired socket receiving locations such as the location 108 on the printed circuit board 100, the holes 109 for receiving the sockets of the wafer are formed in the appropriate socket receiving configuration. Thus, the socket receiving holes of the printed circuit board 100 will be fabricated in series of hole patterns for example, a first series of holes 109 at the location corresponding to the desired location 108 of a first socket 111, a second series of holes (not shown) at the desired location 112 of the second socket 114, a third series of holes (not shown) at the desired location 116 of the third socket 117, and so forth.

Thus, the entire series of sockets can be inserted into the holes of the printed circuit board manually simply by aligning the last socket 117 in the corresponding series of the holes at the last location 116 of the printed circuit board 100, then inserting the last socket into the holes, and subsequently merely pressing the remaining sockets into the holes, which will be at corresponding properly pre-aligned locations, by downward pressure, such as by the finger 120. Thus, the entire series of sockets 111, 114, and 117, can be manually installed in a time which is substantially reduced from that even of machine installation of the sockets of the prior art. Once in place, such as the wafer-socket series 122, the leads (not shown) of the appropriate components (such as the component 123) can be inserted into the sockets and the assembly is complete.

Because the wafer material is relatively thin (a typical thickness, without limitation, being of 20/1000 of an inch) the wafer material will be flexible, to a certain degree. The utilization of the flexibility of the wafer can be seen in FIG. 5 which shows four wafers 129 (holding component 143), 130, 131 and 132, with wafers 129, 130, and 131 already inserted in the circuit board 133 and the wafer 132 being pressed into the board by an operator's finger 134. The pins 135 and 136 have already begun to enter the holes 139 and 140 provided therefore in the board 133. The pins 137 and 138 have not yet entered into their respective holes 141 and 142.

Figure 5:
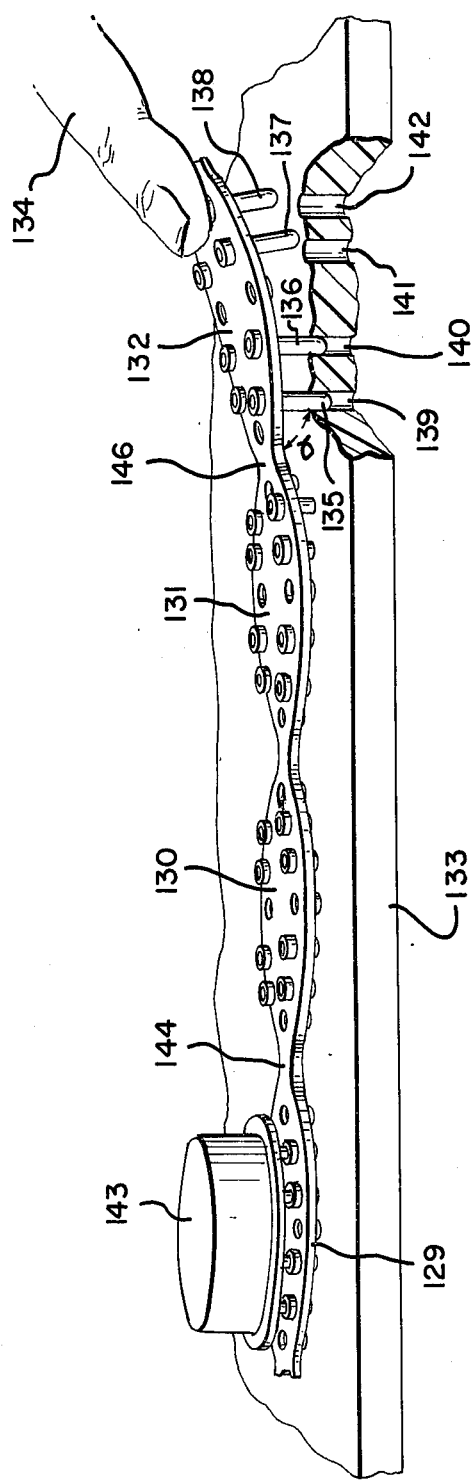
FIG. 5 is a perspective view of a single strip of wafers being inserted into a printed circuit board showing the utilization and advantages of the flexible nature of the wafer material.

It is apparent from FIG. 5 that with the previous wafer 131 already installed in the board 133 it would be virtually impossible to press the pins 135 – 138 of wafer 132 into board 133 unless the wafer 132 and the connecting neck portion 146 both posses a very definite degree of flexibility, and further unless the pins 135 – 138 can pivot somewhat within the wafer 132.

Thus it is necessary that wafers 132 have flexibility as well as the connecting neck portions 144 – 146 therebetween in order to apply the strip of wafers into the circuit board 133. Furthermore, largely because of the flexibility of the wafer 132 each of the pins 135 – 137 can pivot in a limited manner at the point where they are secured within the wafer 132. Such pivoting of the pins allows the angle α between the pin 135 and the undersurface of the wafer 132, for example, to be less than 90° while pin 135 is being inserted into its hole 139.

The amount of wafer flexibility required is dependent upon several factors. Such factors include the length of the connecting neck 144, the length of the pins, such as pins 135 - 138, the amount of pivoting or rotation that the pins, such as pin 135, can experience at the point of connection to the wafer 132, and the amount of off-center tolerance permitted by the post 135 and the socket 139 into which pin 135 fits. As a general criteria of the amount of flexibility required, the wafer 132 should permit the entry of successive ones of pins 135, 136, 137 and 138 into their respective sockets 139 - 142 consecutively in time sequence.

Since any known material has a degree of flexibility, the term "flexibility" as used herein is defined generally in the manner set forth in the preceding paragraph. More specifically, the degree of curvature of a wafer, when applied by a human installer, should not be less than ten degrees. In fact, in one actual reduction of practice, the wafer had a degree of flexibility enabling an operator to bend the wafer 90° or more between his thumb and forefinger without damaging the wafer. However, such a degree of flexibility is not required. Following are examples of types of material that do not have the required degree of flexibility: a printed circuit board substrate of phenolic material, glass, or even teflon or nylon where the thickness thereof is such that a degree of curvature is not greater than a few degrees with pressure that can be applied by a person's finger.

The characteristic of flexibility of the wafer material and of the connecting mechanism between the wafers, such as neck 145, also function to compensate or accommodate for a degree of misalignment between the pins of successive sockets and the corresponding preformed holes in the circuit board. More specifically, if the series of holes for the pins of a given wafer are aligned about a centerline at an angle which is slightly different from that of the centerline angle of the series of holes for the pins of the next wafer, the flexibility of the wafer material and the connecting necks will permit the wafer being installed to be rotatively and pivotally moved about the connecting neck within a limited angular amount and also to be moved towards or away from the previously installed wafer, since the connecting neck portion can either stretch or accordion upon itself.

It is also to be noted, however, that the wafer material, although flexible, will tend to resist torsional forces between the sockets, tending to bias the adjacent sockets into substantial alignment. Thus, if the centerlines of the holes in adjacent series are misaligned, the socket assembly will exert a force upon the component receiving members inserted into the holes attempting to realign the adjacent sockets into a parallel plane. This force additionally will tend to hold the two sockets in their unitary assembly in their inserted positions in the two series of holes. It is apparent, therefore, that if such insertion retaining force is desired, that the holes among the series of holes can be fabricated or formed with their center lines deliberately misaligned one from the other.

Also, by virtue of the flexibility of the material from which the socket string assembly is fabricated, the center lines of the holes through the printed circuit board within a single series, such as the series indicated for the first socket, may be misaligned to a degree (limited by the flexibility of the wafer material) one from the other either in the center line alignment or in the location aspect relative to the center of the socket. The socket, therefore, will be fittable into such misaligned socket, and, additionally, will exhibit a force tending to constrain the socket in its inserted location.

With the socket assembly therefore inserted, an integrated circuit or the like may be then inserted into the appropriate component receiving sockets of the particular socket, such as the integrated circuit 123 shown in FIG. 4.

With the sockets of the assembly inserted, as shown in FIG. 3, the pin or male portion 75 of the component receiving socket will extend through the printed circuit board 80. The through extending portions can thereafter be soldered in place by well known wave soldering techniques, or othewise.

The material of the wafer of the sockets presents an additional advantage in the soldering process in acting as a barrier to solder which may creep up the male portions through the printed circuit boards, by capillary action, or otherwise, to prevent it from flowing over the ends of the lead receiving sockets, thereby preventing the solder from clogging the lead receiving sockets.

As above described, the wafer of the socket is disposed in its inserted location at a location above the surface of the printed circuit board, because of the stand-off protrusions of the partially formed holes. This enables the area between the wafers and the surface of the printed circuit board to be flushed or cleaned to remove any of the soldering debris, such as fluxes, excess solder, or the like, from between the wafers and the printed circuit board. To further facilitate such interspace cleaning, holes, such as the holes 125 shown in FIGS. 2 and 4, may be formed at a central location within the wafers.

Because the sockets are formed from a continuous strip of material, they can easily be automatically fabricated, such as by beginning with a strip of material, automatically stamping the material to form the required perforations and partial perforations, as above described, subsequently automatically inserting the component receiving sockets and then rolling the completed socket assemblies onto a roll for storage. Because the socket assembly is fabricated by merely stamping the wafer material, such problems encountered in forming precast units in the prior art as die repairs and the like are obviated.

Although the invention has been described and illustrated with a certain degree of particularlity, it is understood that the present disclosure has been made only by way of example and that numerous changes in the details of construction and the combination and arrangement of parts may be resorted to without departing from the spirit and scope of the invention as hereinafter claimed.

I claim:

1. An assembly of connected socket assemblies mounted upon predetermined patterns of holes in a substrate, each constructed to receive a component and each comprising:

a wafer of insulative material with a plurality of holes formed therethrough in said predetermined pattern;

a plurality of sockets having an open ended tubular portion individually positioned in said holes with said open end of said sockets being on a first side of said wafer and the tubular portion of said sockets extending through said wafer;

said tubular portions of said sockets constructed to contact fit within the holes in said substrate;

flexible connecting means connected between adjacent ones of said socket assemblies and being of a length to separate adjacent wafers a distance equal to the distance between adjacent patterns of holes to enable mounting of at least two of said socket assemblies upon said substrate with the tubular portions of the sockets of a given wafer, while being mounted, being aligned with the predetermined pattern of holes by the established alignment of said tubular portions of said sockets of the adjacent wafer which was mounted immediately preceding the mounting of said given wafer.

2. An assembly as in claim 1 in which said flexible connecting means is integral with said wafers and is narrower than the width of the adjacent connected wafers to an extend which enables error compensating elongation and contraction of the spacing between the groups of second terminals on adjacent connected wafers in order for such spacing to coincide with the spacing between adjacent predetermined patterns of female receptacle holes in said substrate.

3. An assembly as in claim 1 which said flexible connecting means further comprises an aperture therein which forms strips of said flexible insulative material on either side thereof which extend between said adjacent connected wafers to further facilitate elongation and contraction between said adjacent connected wafers and also to facilitate complete separation of said adjacent connected wafers.

4. An assembly as in claim 1 in which each of said wafers further comprise a plurality of embossments on that side thereof which faces said substrate;

said embossments providing pedestals for said wafer to maintain the said wafer above the facing surface of said substrate a predetermined distance.

5. A component mounting means for mounting components having mounting terminal pins upon a substrate and comprising:

a plurality of socket assemblies each mountable within a predetermined pattern of holes in said substrate, each constructed to receive and retain a component thereon, and each comprising:

a flat, wafer-like element of an insulative material with a plurality of holes therethrough; and a plurality of terminals each having a tubular body with a first end thereof open, and individually positioned in said holes with the open end being on a first side of said wafer-like element and with the tubular body extending through said holes in said wafer-like element and into the holes in said substrate, and constructed to receive the terminal pins of said component in said tubular bodies extending through said wafer-like elements;

a flexible connecting means connected between adjacent ones of said socket assemblies and being of a length to separate adjacent wafers a distance equal to the distance between adjacent predetermined position patterns of holes in said substrate to enable successive mounting of adjacent socket assemblies contained in a strip of at least two of said socket assemblies upon a receiving substrate with the alignment of the tubular bodies of each socket assembly, when being mounted, being determined by the established alignment of the tubular bodies of the immediately preceding mounted socket assembly; and in which said flexible connecting means is integral with said wafer-like elements and is narrower than the width of the adjacent connected wafers to an extent which enables error compensating elongation and contraction of the spacing between the groups of pin-like portions on adjacent connected wafers in order for such spacing to coincide with the spacing between adjacent predetermined patterns of holes in said substrate.

6. A component mounting means as in claim 5 in which said flexible connecting means further comprises an aperture therein to form strips of said flexible insulative material on either side thereof which extend between said adjacent connected wafers to further facilitate elongation and contraction between said adjacent connected wafers and also to facilitate complete separation of said adjacent connected wafers.

7. A component mounting means for mounting components upon a substrate having a plurality of first terminals arranged in a series of predetermined position patterns and comprising:

a plurality of socket assemblies each constructed to be mountable within one of said predetermined position patterns of said first terminals in said substrate, to receive a component having a plurality of second terminals each of which is positioned within one of said positions of said predetermined position patterns, and each comprising:

a wafer of flexible, insulative material with a plurality of third terminals mounted therethrough;

each of said plurality of third terminals comprising a tubular body opened at a first end thereof and positioned to coincide with one of the positions of said predetermined position pattern, with said first ends of said third terminals being on a first side of said wafer and constructed to mate with one of the second terminals of one of said components, and with the tubular bodies of said third terminals extending through and beyond the other side of said wafer and constructed to mate with one of said first terminals of said substrate; and a flexible connecting means connected between adjacent ones of said socket assemblies and being dimensioned to enable successive mounting of the tubular bodies of said third terminals of adjacent socket members in a strip of at least two of said socket assemblies in the first terminals of said substrate with the alignment of the third terminals of each wafer, while being mounted, being aligned with said first terminals by the established alignment of the third terminals of the immediately preceding mounted wafer.

* * * * *